(12) United States Patent
Katsuse et al.

(10) Patent No.: US 10,999,947 B2
(45) Date of Patent: May 4, 2021

(54) VEHICLE CONTROL APPARATUS

(71) Applicant: DENSO CORPORATION, Kariya (JP)

(72) Inventors: Ryuhei Katsuse, Kariya (JP); Yosuke Matsuo, Kariya (JP); Keisuke Atsumi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/835,392

(22) Filed: Mar. 31, 2020

(65) Prior Publication Data

US 2020/0323094 A1 Oct. 8, 2020

(30) Foreign Application Priority Data

Apr. 3, 2019 (JP) .............................. JP2019-071257

(51) Int. Cl.
*H05K 5/06* (2006.01)
*H05K 7/14* (2006.01)
*B60R 16/023* (2006.01)
*H05K 5/00* (2006.01)

(52) U.S. Cl.
CPC ........... *H05K 5/06* (2013.01); *B60R 16/0239* (2013.01); *H05K 5/0017* (2013.01); *H05K 5/0056* (2013.01); *H05K 5/0069* (2013.01); *H05K 5/0082* (2013.01); *H05K 7/1427* (2013.01)

(58) Field of Classification Search
CPC ....................................................... H05K 5/06
USPC ......................................................... 174/520
See application file for complete search history.

(56) References Cited

U.S. PATENT DOCUMENTS

2018/0222408 A1* 8/2018 Shigyo ................... H02G 3/088
2019/0386473 A1* 12/2019 Kawashita .......... B60R 16/0238
2020/0248811 A1* 8/2020 Fukuyama ............... F16J 15/40

FOREIGN PATENT DOCUMENTS

JP 2002-250430 A 9/2002
JP 2013-002523 A 1/2013

OTHER PUBLICATIONS

U.S. Appl. No. 16/835,536, filed Mar. 31, 2020, Atsumi et al.

* cited by examiner

*Primary Examiner* — Stanley Tso
(74) *Attorney, Agent, or Firm* — Posz Law Group, PLC

(57) ABSTRACT

A vehicle control apparatus is disposed inside a housing for accommodating a transmission. The vehicle control apparatus includes a metal base, a resin case, a printed circuit board on which an electronic component mounts, and an oil-tight seal member. The metal base is made of metal. The resin case is attached to the metal base to form an interior space. The printed circuit board is disposed in the interior space. The oil-tight seal member is disposed between the metal base and the resin case to surround the printed circuit board. The electronic component is included in a control circuit for the transmission. The metal base and the oil-tight seal member are at a hydrogen bonding state, and the rein case and the oil-tight seal member are at a covalent bonding state.

7 Claims, 13 Drawing Sheets

VEHICLE CONTROL APPARATUS

CROSS REFERENCE TO RELATED APPLICATIONS

This application is based on Japanese Patent Application No. 2019-071257 filed on Apr. 3, 2019, the disclosure of which is incorporated herein by reference.

TECHNICAL FIELD

The present disclosure relates to a vehicle control apparatus.

BACKGROUND

Devices for controlling a vehicle have been integrated with an electromechanical system including a sensor, an actuator or an integrated system having both of the sensor and actuator. Therefore, the demand for miniaturization, heat resistance, sealability, resistance against vibration, or the like of a control device has been increasing. For example, a control device may be disposed in an oil-immersion environment for satisfying the demand.

SUMMARY

The present disclosure describes a vehicle control apparatus for controlling a transmission for a vehicle.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
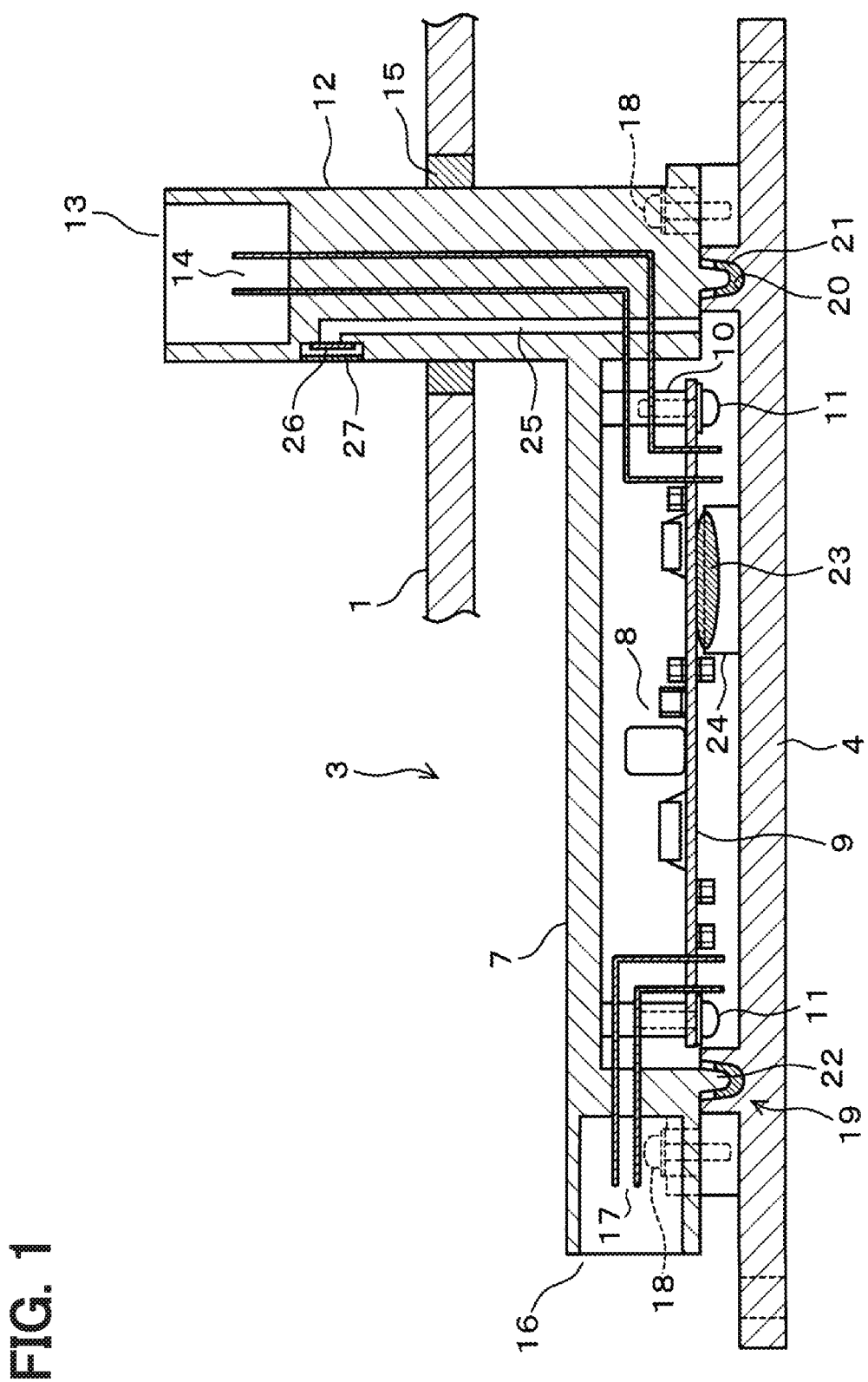
FIG. 1 is a cross-sectional view illustrating the configuration of a TCU according to a first embodiment.

A vehicle control device for controlling a vehicle may be disposed in an oil-immersion environment for satisfying a demand such as miniaturization, heat resistance, sealability, resistance against vibration, or the like.

However, circuit components in a control device may deteriorate as oil enters the control device. For example, disconnection due to oil corrosion or short circuit caused by foreign substances may happen. With regard to a waterproof measure taken for the control device, a casing of the control device may be sealed by a silicon sealing material. However, in a situation where such a sealing structure is placed in oil, the silicon sealing material may swell with oil. Therefore, the sealability may not be maintained.

In one or more embodiments of the present disclosure, a vehicle control apparatus has stable sealability even though the vehicle control apparatus is covered by oil.

According to an aspect of the present disclosure, a vehicle control apparatus is disposed inside a housing for accommodating a transmission at an atmosphere of lubricant oil. The vehicle control apparatus may be covered by the lubricant oil. The vehicle control apparatus includes a metal base, a resin case, a printed circuit board and an oil-tight seal member. The resin case is attached to the metal base to form an interior space. The printed circuit board has an electronic component mounted on the printed circuit board. The electronic component is included in a control circuit for the transmission. The printed circuit board is disposed in the interior space. The oil-tight seal member is disposed between the metal base and the resin case to surround the printed circuit board. The metal base and the oil-tight seal member are at a hydrogen bonding state, and the resin case and the oil-tight seal member are at a covalent bonding state.

The adhesion strength is enhanced as the metal base and the oil-tight seal member are at the hydrogen bonding state, and the resin case and the oil-tight seal member are at the covalent bonding state.

In one or more embodiments of the present disclosure, the metal base is made of aluminum and applied with anodizing treatment. Therefore, the interface between the metal base and oil-tight seal member may be set at an optimal state for the hydrogen bonding.

In one or more embodiments of the present disclosure, the resin case is applied with plasma treatment. Therefore, the interface between the resin case and the oil-tight seal member may be set at an optimal state for the covalent bonding.

In one or more embodiments of the present disclosure, the oil-tight seal member includes fluororubber. Therefore, the oil-tight seal member has a relatively high resistance to the oil for lubrication, and has flexibility.

In one or more embodiments of the present disclosure, a recess for accommodating the oil-tight seal member is disposed at one of the metal base and the resin case, and a protrusion is disposed at the other one of the metal base and the resin case for pressing a central portion of the oil-tight seal member accommodated in the recess. In a case where the resin case is attached to the metal base, the spacing formed between the recess and the tip of the protrusion extending in an extension direction has a larger width than the spacing formed between the recess and the protrusion in a direction perpendicular to the extension direction. Therefore, it is possible to reduce vibration in a vertical direction (or the extension direction) transmitted to the printed circuit board when the vehicle is travelling. Hence, the resistance against vibration may be enhanced.

In one or more embodiments, the resin case is integrated with a connector penetrating inside and outside the housing. The connector has a ventilation hole for communicating with the interior space between the resin case and the metal case and outside of the housing. A breathable filter is disposed at a location where the ventilation hole faces the outside of the housing.

Since the space formed between the metal case and the resin case communicates with outside through the ventilation hole provided at the connector, the inner pressure does not change when the temperature inside the housing changes. Therefore, it is possible to reduce stress applied to the structure. Additionally, since the breathable filter at a location where the ventilation hole faces the outside, it is possible to inhibit a situation in which foreign substances are mixed into the housing. Moreover, the ventilation hole is provided at the connector penetrating inside and outside the housing, it is possible to miniaturize the vehicle control apparatus.

First Embodiment

Figure 7:
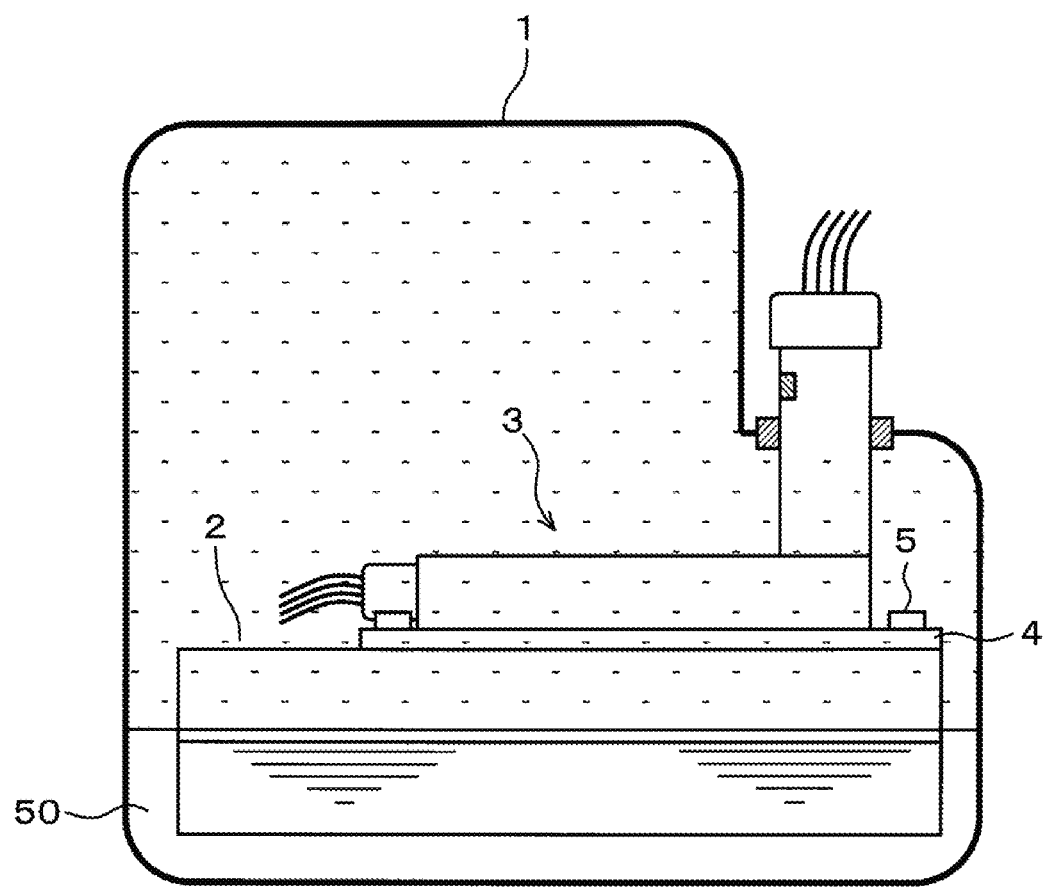
FIG. 7 is a schematic view showing the interior of a transmission case in a see-through manner.

As illustrated in FIG. 7, a valve body 2 having a hydraulic control oil passage formed inside of the valve body 2 mounts on an inner bottom part of a transmission case 1 corresponding to a housing. The transmission case 1 may also be referred to as a T/M case 1. A transmission control unit 3, which corresponds to a vehicle control apparatus according to the present embodiment, is disposed on the valve body 2. The transmission control unit 3 may also be referred to as TCU 3. A metal base 4 of the TCU 3 is substantially in a rectangular shape, and is fixed on the valve body 2 with a screw 5.

Automatic transmission fluid 50, which corresponds to oil for lubrication, is injected into the T/M case 1. The automatic transmission fluid 50 may also be referred to as ATF 50. In other words, the TCU 3 is disposed in the atmosphere of the ATF 50, and is covered by the ATF 50. The metal base 4 is made of, for example, aluminum applied with anodizing treatment (or alumite treatment). Although not shown, mechanism as a main body of the transmission is disposed inside the T/M case 1.

As illustrated in FIG. 1, a resin case 7 of the TCU 3 is attached to the metal base 4 through an oil-tight structure, and thus an interior space is formed. The resin case 7 may also be referred to as a resin cover. A printed circuit board 9 on which an electronic component 8 mounts is accommodated in an interior space formed by attaching the resin case 7 to the metal base 4 through the oil-tight structure. The details of the oil-tight structure are described hereinafter. The electronic component 8 includes a control circuit for transmission. However, the details of the electronic component 8 are not described herein. Multiple attaching bosses 10 are disposed at the resin case 7, and the printed circuit board 9 is fixed to the attaching bosses 10 through screws 11. As illustrated in FIG. 1, the attaching bosses 10 extend to the bottom from the top.

A penetration connector 12 is integrated with the resin case 7. The penetration connector 12 extends upward as shown at the right side of FIG. 1. The penetration connector 12 penetrates a partition wall of the T/M case 1, and protrudes to the outside of the T/M case 1. The tip portion of the penetration connector 12 is a vehicle-side connector 13. One end of a vehicle-side wiring 14 is connected to the printed circuit board 9, and the other end of the vehicle-side wiring 14 is connected to a connector terminal of the vehicle-side connector 13. The vehicle-side connector 13 is used for electrically connecting the TCU 3 to a control apparatus at the vehicle side. A seal member 15 is disposed between the penetration connector 12 and the partition wall of the T/M case 1.

A load-side connector 16 is integrated with the resin case 7 as illustrated at the left side of FIG. 1. One end of the load-side wiring 17 is connected to the printed circuit board 9, and the other end of the load-side wiring 17 is connected to a connector terminal of the load-side connector 16. The load-side connector 16 is used to connect the TCU 3 to a device, which is objected to be electrically controlled, inside the valve body 2.

Figure 2:
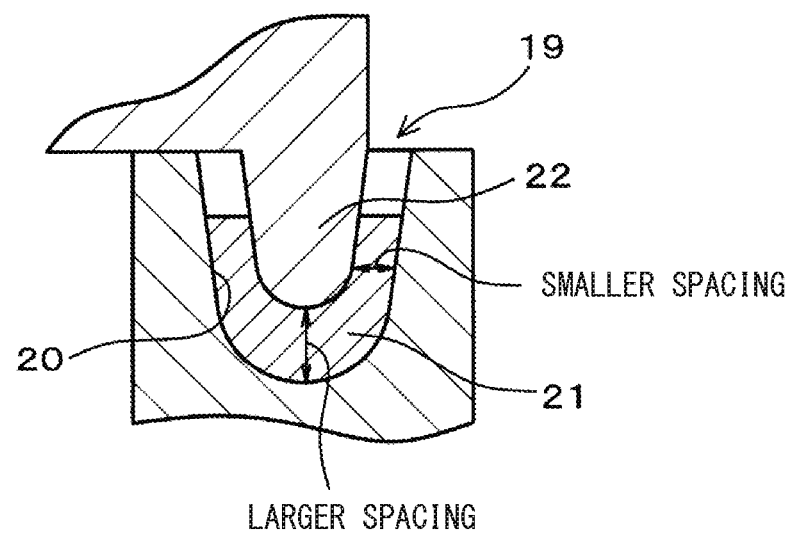
FIG. 2 is an enlarged sectional view showing the configuration of an oil-tight structure.
Figure 3:
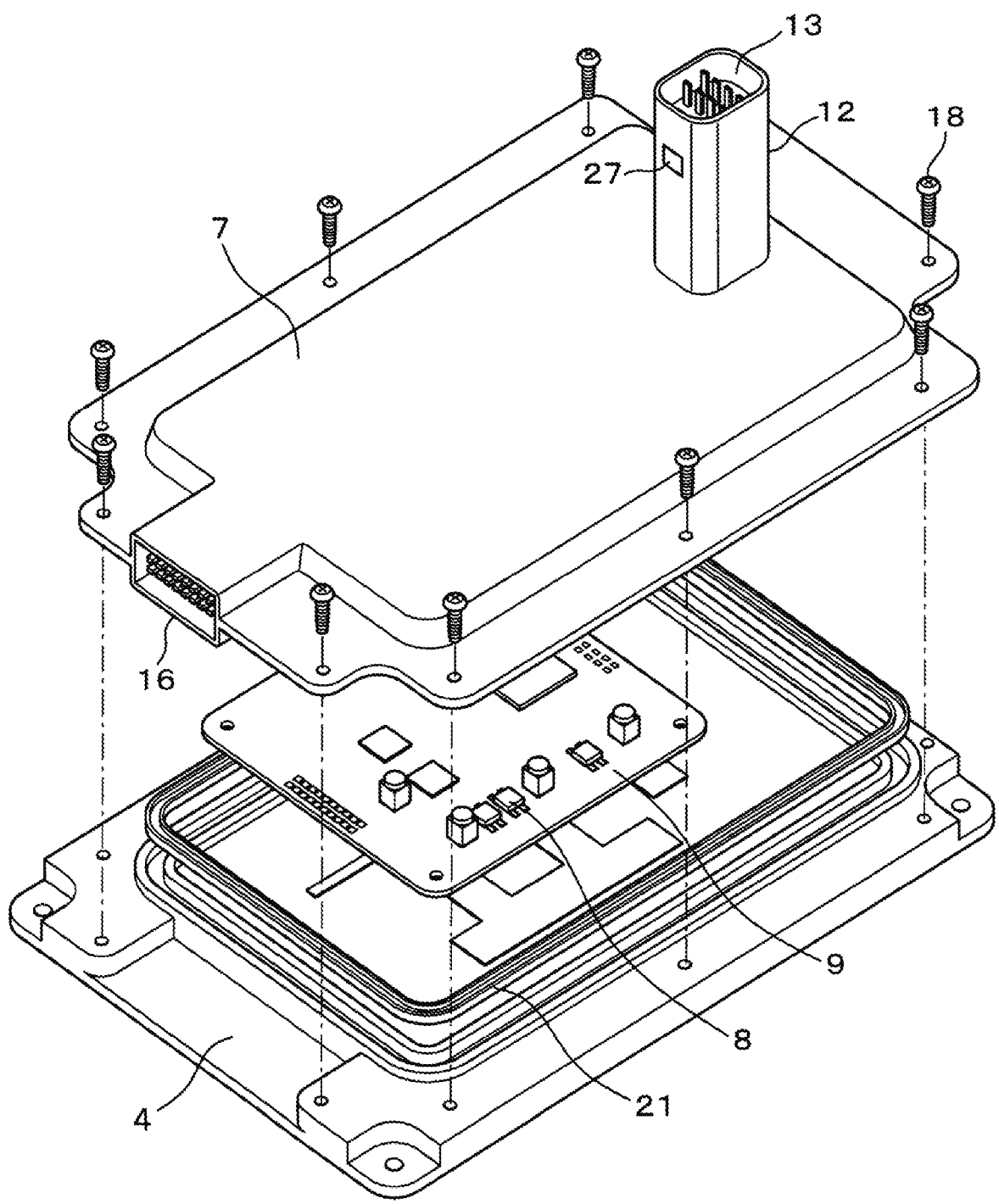
FIG. 3 is an exploded perspective view of the TCU.
Figure 4:
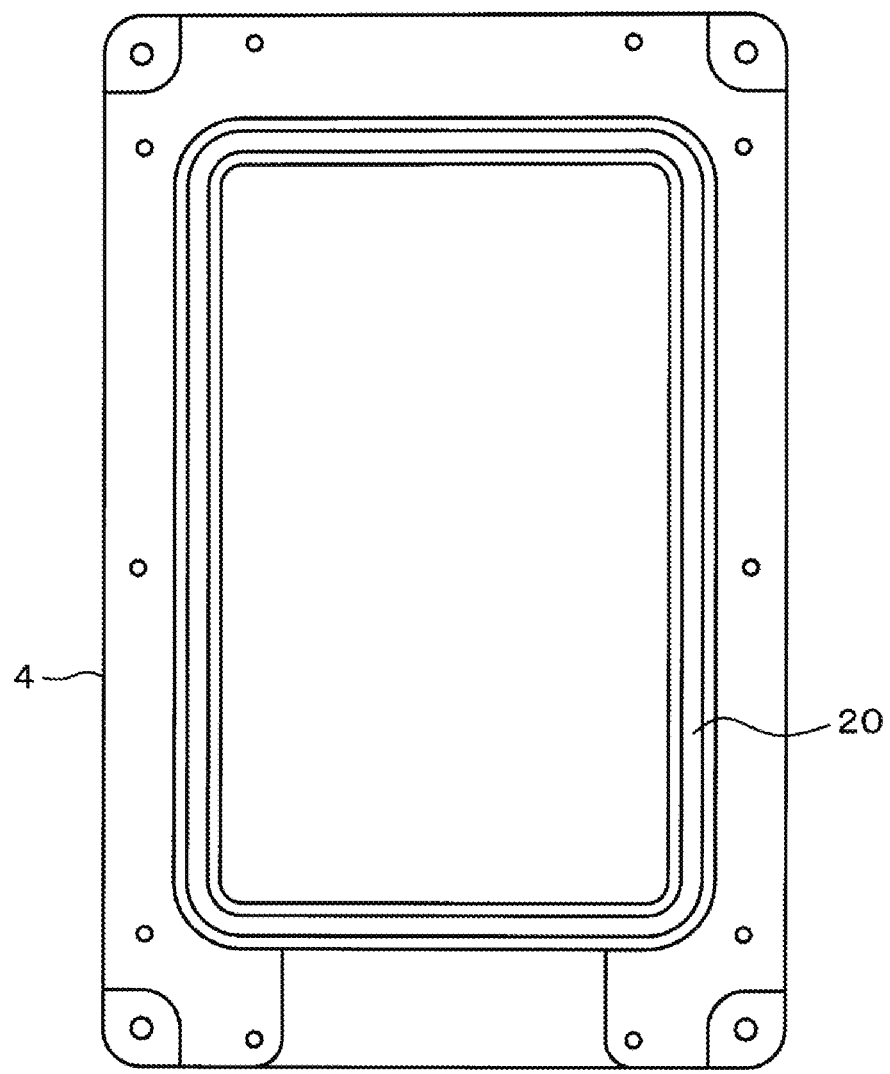
FIG. 4 is a plan view of a metal base.
Figure 5:
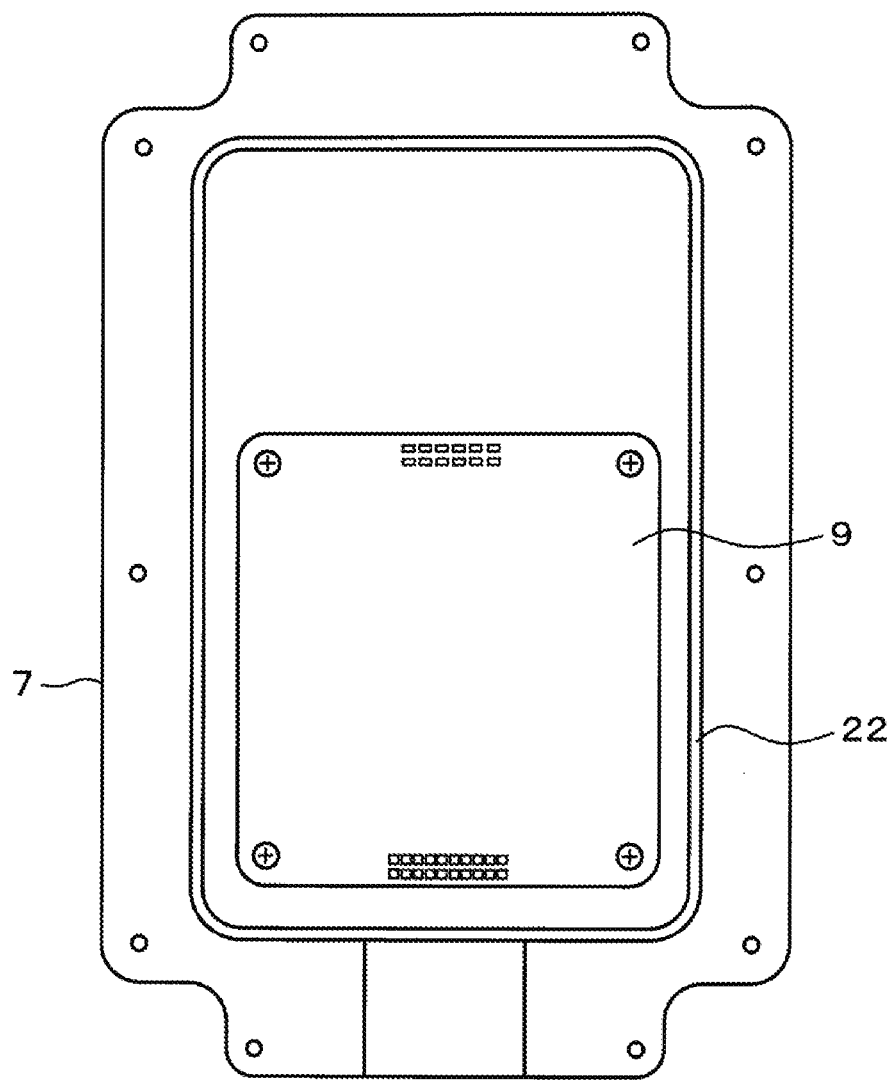
FIG. 5 is a bottom view of a resin cover.

As illustrated in FIG. 3, the resin case 7 is fixed to the metal base 4 through multiple screws 18. As illustrated in FIG. 1, an oil-tight structure 19 is formed at an inner peripheral part of the fixation location to surround an outer peripheral part of the printed circuit board 9. The oil-tight structure 19 includes a groove 20, an oil-tight seal member 21, and a protrusion 22. As illustrated in FIG. 4, the groove 20 is disposed at the metal base 4 as viewed from a surface of the metal base 4. As illustrated in FIG. 2, the oil-tight seal member 21 is disposed at the groove 20. As illustrated in FIG. 5, the protrusion 22 is disposed at the resin case 7 as viewed from a surface of the resin case 7. The oil-tight seal member 21 is made of, for example, fluororubber. The groove 20 may also be referred to as a recess.

A support member 24 is disposed at the metal base 4. The support member 24 faces upward and supports the heat radiation member 23. The heat radiation member 23 may also be referred to as heat radiation adhesive 23. When the resin case 7 is attached to the metal base 4, the lower surface of the printed circuit board 9 is in contact with the heat radiation adhesive 23, which mounts on the support member 24. With regard to the heat radiation adhesive 23, hardening treatment is processed after the assembly of the TCU 3. The heat generated by the printed circuit board 9 is conducted to the metal base 4 through the heat radiation adhesive 23 and the support member 24, and then the heat is radiated.

FIG. 2 illustrates a cross-sectional shape of the oil-tight structure 19 in a deformation form. In a situation where the resin case 7 is attached and fixed to the metal base 4 and the protrusion 22 enters the groove 20, the shape of each portion is set such that the thickness of the oil-tight seal member 21 in a vertical direction as illustrated in FIG. 2 is larger than the thickness of the oil-tight seal member 21 in a horizontal direction as illustrated in FIG. 2. For example, the thickness of the oil-tight seal member 21 in the vertical direction (or a first direction) is set about 2.0 mm, and the thickness of the oil-tight seal member 21 in the horizontal direction (or a second direction) is set about 1.0 mm. Therefore, it is possible to largely reduce vibration in the vertical direction transmitted to the printed circuit board 9 in a situation where the vehicle is travelling. Hence, vibration-proof characteristics may be enhanced.

Figure 6:
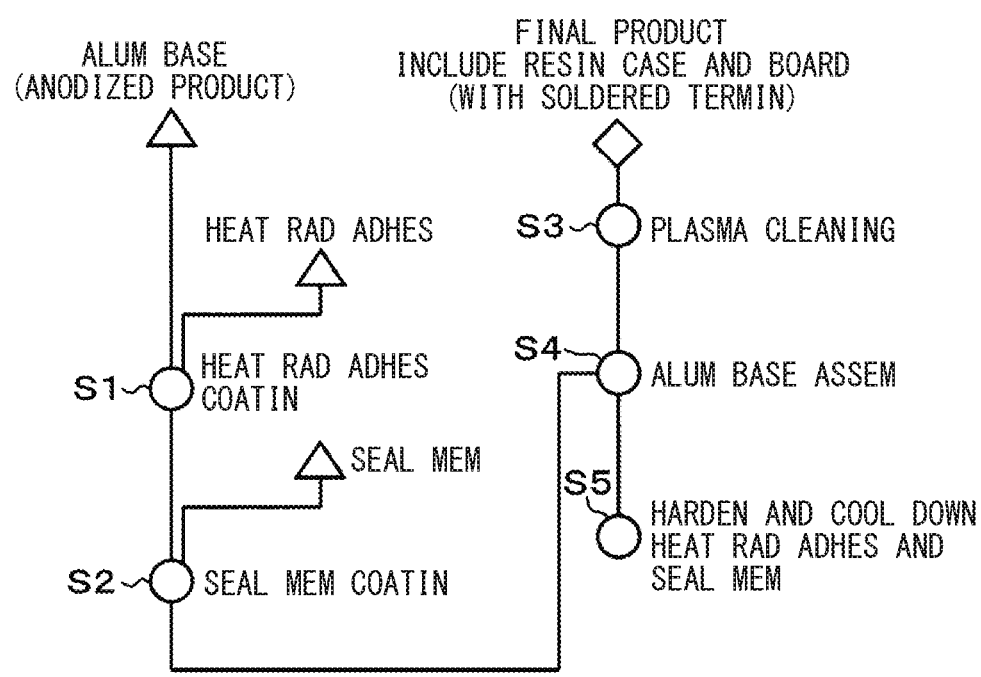
FIG. 6 is a flowchart showing an assembly process of the TCU.

The following describes a flow of assembling the TCU 3. As illustrated in FIG. 6, the heat radiation adhesive 23 is coated on the metal base 4, which is applied with the anodizing treatment, at S1. Subsequently, the oil-tight seal member 21 is coated inside the groove 20 at S2. The resin case 7, which is assembled with the printed circuit board 9, is applied with plasma cleaning at S3. The resin case 7 is assembled with the metal base 4 at S4 and then applied with heat treatment, the oil-tight seal member 21 and the heat radiation adhesive 23 are hardened and then cool down at S5.

By performing the process described above, the anodized metal base 4 and the oil-tight seal member 21 are at a hydrogen bonding state. The resin case 7 processed by the plasma cleaning treatment and the oil-tight seal member 21 are at a covalent bonding state. In other words, hydrogen bonding is formed between the metal base 4 and the oil-tight seal member 21, and covalent bonding is formed between the resin case 7 and the oil-tight seal member 21.

As illustrated in FIG. 1, a ventilation hole 25 is formed in the penetration connector 12. The ventilation hole 25 allows communication between interior space and exterior space of the TCU 3. The printed circuit board 9 is stored in the interior space of the TCU 3. A breathable filter 26 having air permeability is disposed at a location where the ventilation hole 25 faces the external space. A cover 27 is disposed outside the breathable filter 26.

According to the present embodiment, the TCU 3 is disposed under an environment where the interior of the T/M case 1 may be covered by the ATF 50. The TCU 3 includes the metal base 4 and the resin case 7. The resin case 7 is integrated with the connector 12, and is attached to the metal base 4. The connector 12 penetrates the T/M case 1. The electronic component 8, which is included in the control circuit for transmission, mounts on the printed circuit board 9. The printed circuit board 9 is disposed in the interior space formed between the metal base 4 and the resin case 7. The oil-tight seal member 21 is disposed between the metal base 4 and the resin case 7 to surround the periphery of the printed circuit board 9. The penetration connector 12 has a ventilation hole 25 communicating between the interior space of the T/M case 1 and the exterior part of the T/M case 1, and the breathable filter 26 is disposed at a location where the ventilation hole 25 faces outside.

Since the space formed between the metal base 4 and the resin case 7 has communication with outside through the ventilation hole 25, the interior pressure may not change as the temperature inside the T/M case 1 changes. Hence, it is possible to reduce stress applied to the structure. It may be possible to inhibit a situation in which foreign substances enter the T/M case 1 by disposing the breathable filter 26 at a location where the ventilation hole 25 faces outside.

Since the ventilation hole 25 is provided at the penetration connector 12, it may be possible to reduce the size of the TCU 3. Since the cover 27 is provided to cover at least a part of the breathable filter 26, it may be possible to avoid a situation where the breathable filter 26 is touched and damaged when an operator performs installation or the like.

The metal base 4 and the oil-tight seal member 21 are at a hydrogen bonding state, and the resin case 7 and the oil-tight seal member 21 are at a covalent bonding state. Therefore, the adhesive strength may be enhanced to prevent the ATF 50 from entering the interface between the metal base 4 and the oil-tight seal member 21 and the interface between the resin case 7 and the oil-tight seal member 21.

Since the metal base 4 is made of aluminum and applied with the anodizing treatment and the resin case 7 is applied with the plasma treatment, the interface formed between the metal base 4 and the oil-tight seal member 21 is set to an optimal state for hydrogen bonding and the interface formed between the resin case 7 and the oil-tight seal member 21 is set to an optimal state for covalent bonding. Since the oil-tight seal member 21 is made of fluororubber, a material having relatively high resistance to the ATF 50 and having flexibility may be used.

The groove 20 for accommodating the oil-tight seal member 21 is formed at the metal base 4. The protrusion 22 is formed at the resin case 7 to press the central portion of the oil-tight seal member 21. The shape of the groove 20 is set such that, when the resin case 7 is attached to the metal base 4, the spacing in an extension direction from the tip of the protrusion 22 has a longer width than the spacing in a direction perpendicular to the extension direction. Therefore, it is possible to reduce vibration in a vertical direction (or the extension direction) transmitted to the printed circuit board 9 in a situation that the vehicle is travelling. Hence, resistance against vibration may be enhanced.

According to the present disclosure, the plasma treatment (or the plasma cleaning treatment) is performed on the resin case 7 to vaporize dirt as carbon dioxide in order to eliminate the dirt on the resin case. Therefore, the dirt removal allows the resin case 7 to form stronger covalent bonding with the oil-tight seal member 21.

Second Embodiment

Hereinafter, the identical parts as those in the first embodiment are designated by the same reference numerals, and explanations thereof are omitted. Differences from the first embodiment are described. In the TCU 31 according to the second embodiment as illustrated in FIG. 2, a female connector 32, which is connected to the vehicle-side connector 13 as a male connector, includes a lever 33, which is rotatable to lock the connection between the female connector 32 and the vehicle-side connector 13.

Figure 8:
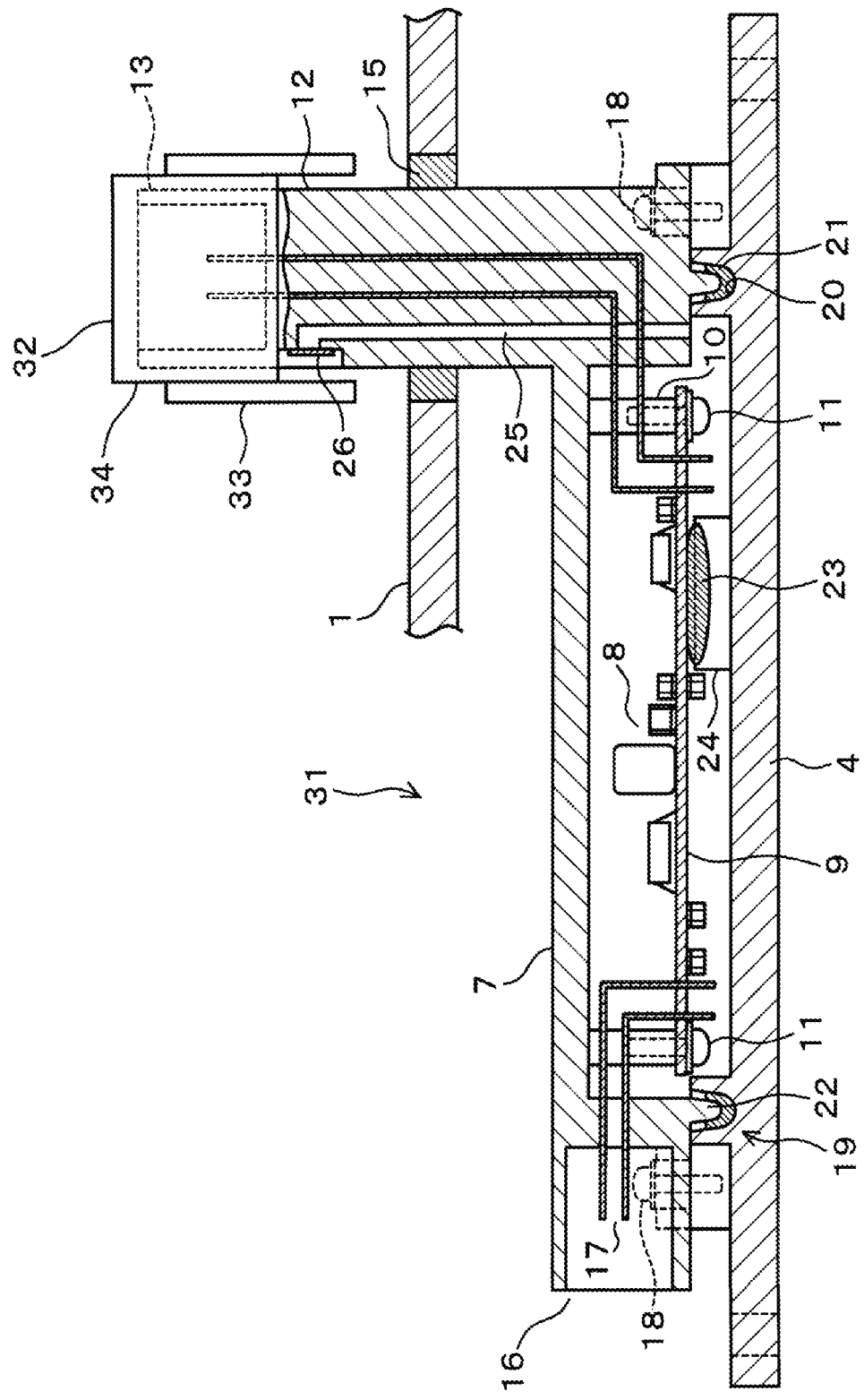
FIG. 8 is a cross-sectional view illustrating the configuration of a TCU according to a second embodiment.

The lever 33 has: a one end that is rotatably supported by a housing 34 of the female connector 32; and the other end that rotates in a range of, for example, 90 degrees between a depth direction and a downward direction as shown in FIG. 8. The depth direction is a direction going away from the plane of the drawing of FIG. 8. The connection of the female connector 32 is locked as illustrated in FIG. 8. In replacement of the cover 27, the lever 33 covers the outside of the breathable filter 26. According to the second embodiment, the lever 33 of the female connector 32 is adopted as the cover of the breathable filter 26. Therefore, the number of components may be reduced.

Third Embodiment

Figure 9:
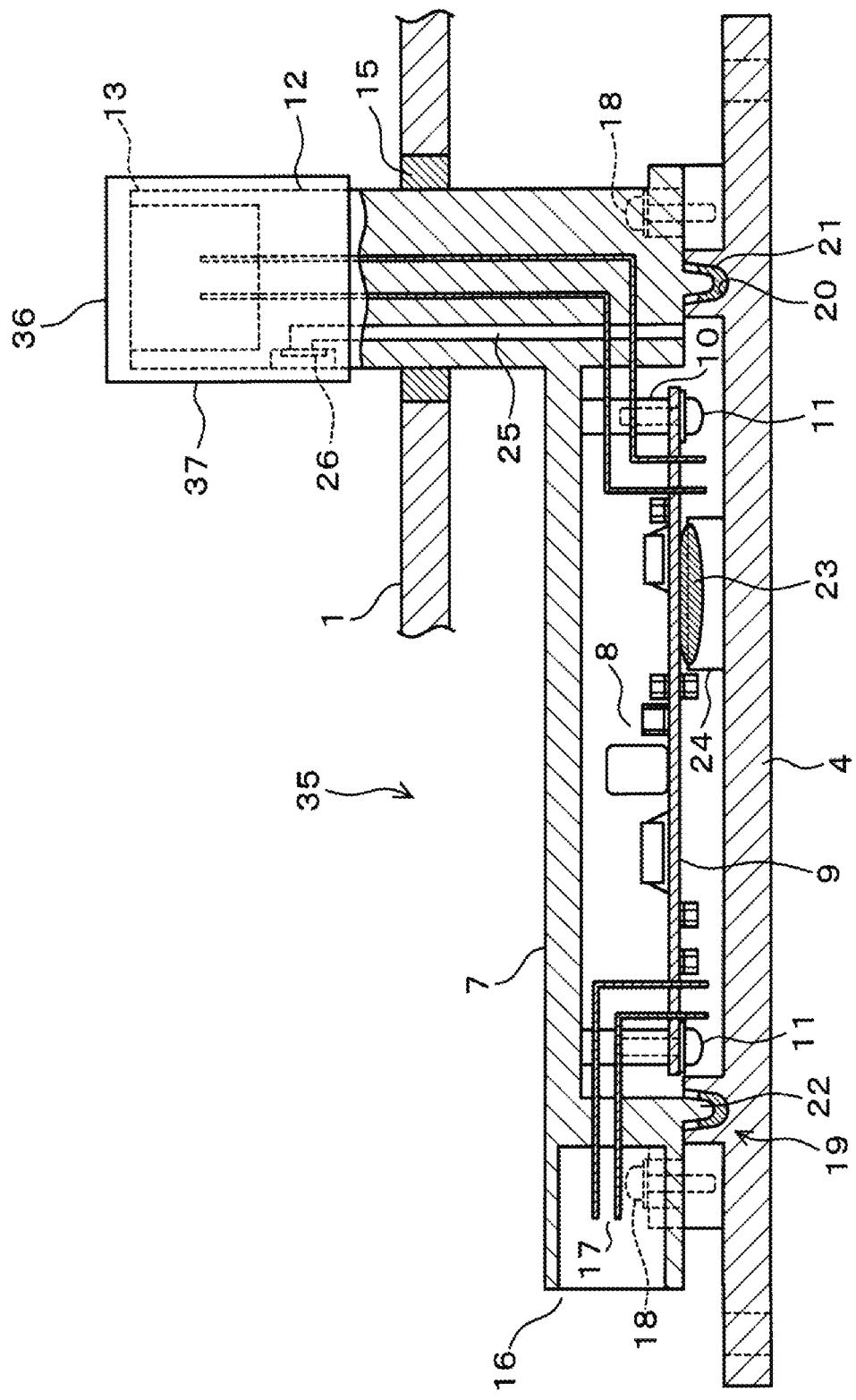
FIG. 9 is a cross-sectional view illustrating the configuration of a TCU according to a third embodiment.

In the TCU 35 according to a third embodiment as illustrated in FIG. 9, the female connector 36, which is connected to the vehicle-side connector 14, is similar to the one in the second embodiment for covering the outside of the breathable filter 26. However, in the third embodiment, when the female connector 36 and the vehicle-side connector 13 are connected, a housing 37 of the female connector 36 covers the outside of the breathable filter 26.

According to the third embodiment, a part of the housing 37 of the female connector 36 is adopted as the cover of the breathable filter 26. Therefore, it is possible to reduce the number of components, as similar to the second embodiment.

Fourth Embodiment

Figure 10:
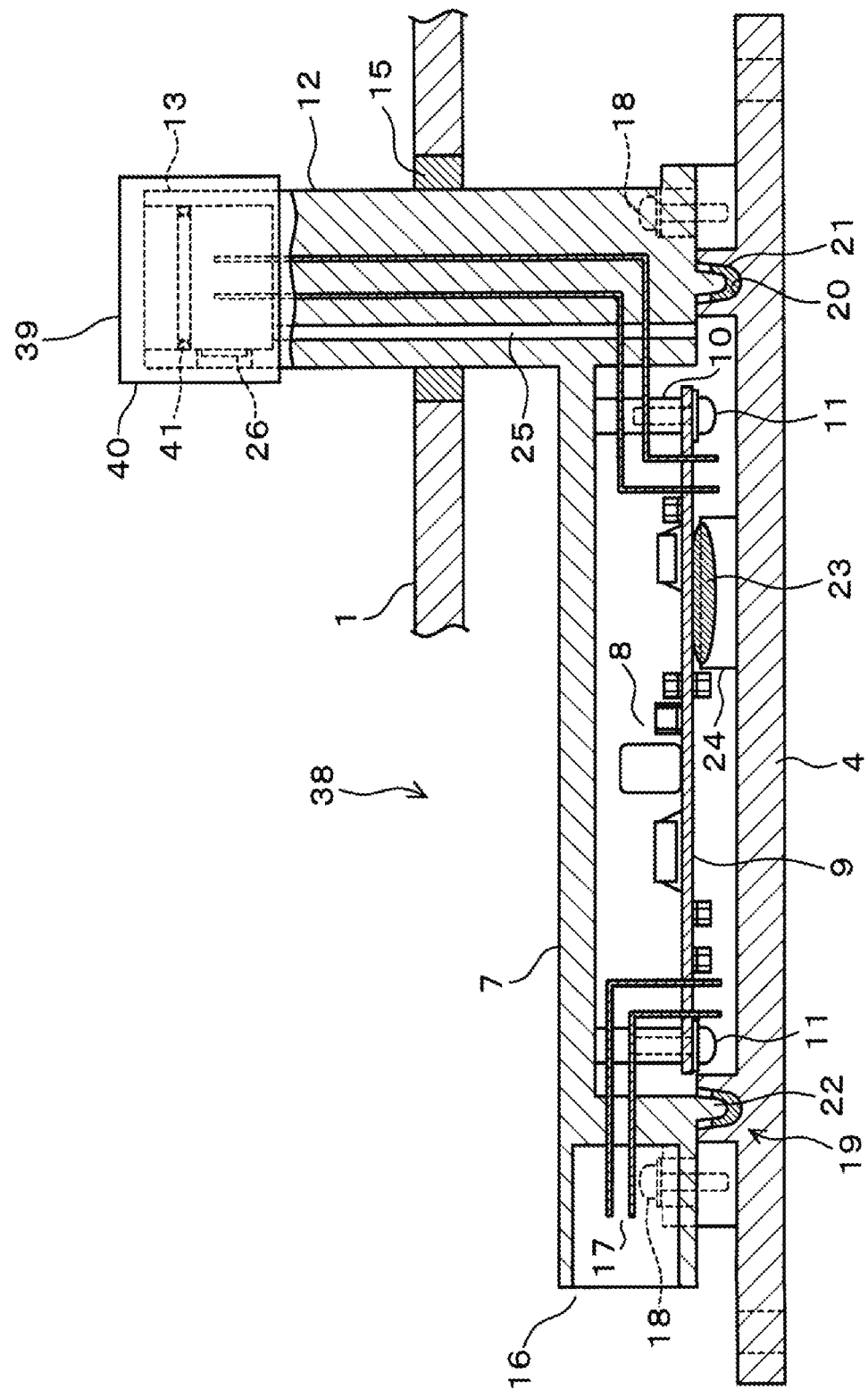
FIG. 10 is a cross-sectional view illustrating the configuration of a TCU according to a fourth embodiment.

In a TCU 38 according to a fourth embodiment as illustrated in FIG. 10, a female connector 39, which is connected to the vehicle-side connector 13, is similar to the one in the third embodiment for covering the outside of the breathable filter 26. Additionally, it is similar that a housing 40 of the female connector 39 covers the outside of the breathable filter 26. However, the female connector 39 includes an O-ring 41 for waterproofing. The breathable filter 26 is disposed to cover the space where the O-ring 41 and the connector terminal of the vehicle-side connector 13 as the male connector are located.

Fifth Embodiment

Figure 11:
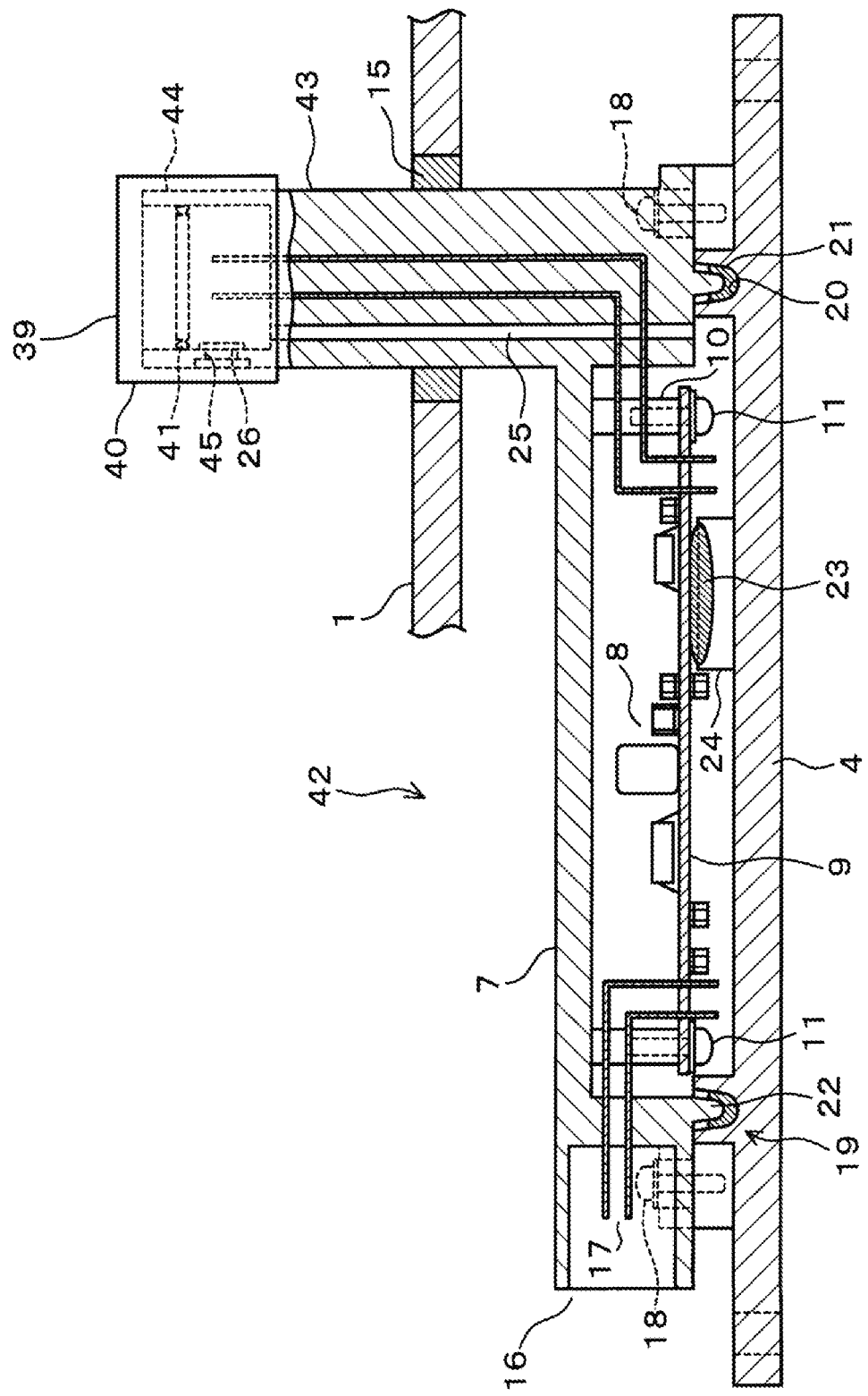
FIG. 11 is a cross-sectional view illustrating the configuration of a TCU according to a fifth embodiment.

In a TCU 42 according to a fifth embodiment as illustrated in FIG. 11, a female connector 39, which is connected to a vehicle-side connector 44, is similar the one in the fourth embodiment for covering the outside of the breathable filter 26. However, in replacement of the penetration connector 12, a penetration connector 43 allows communication between the outside of the ventilation hole 25 and the inside of the vehicle-side connector 44. In this embodiment, the vehicle-side connector 44 replaces the vehicle-side connector 13. A communication hole 45, which is communicable with outside, is formed at a part of a housing of the vehicle-side connector 44. The breathable filter 26 is disposed inside of the housing of the vehicle-side connector 44.

Sixth Embodiment

Figure 12:
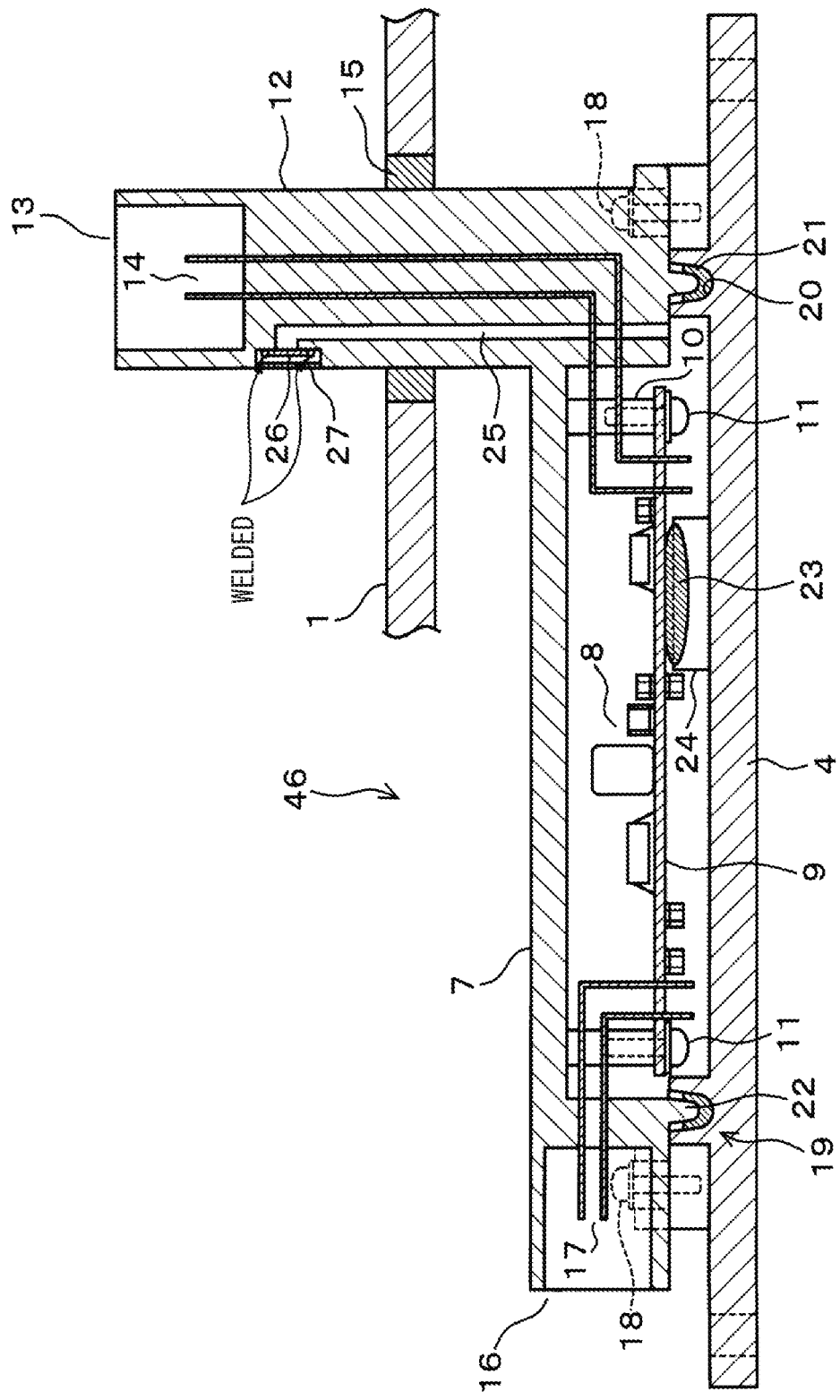
FIG. 12 is a cross-sectional view illustrating the configuration of a TCU according to a sixth embodiment.

A TCU 46 according to a sixth embodiment as illustrated in FIG. 12 is different from the TCU 3 according to the first embodiment. In this embodiment, the breathable filter 26 is welded to the housing of the vehicle-side connector 13.

Seventh Embodiment

Figure 13:
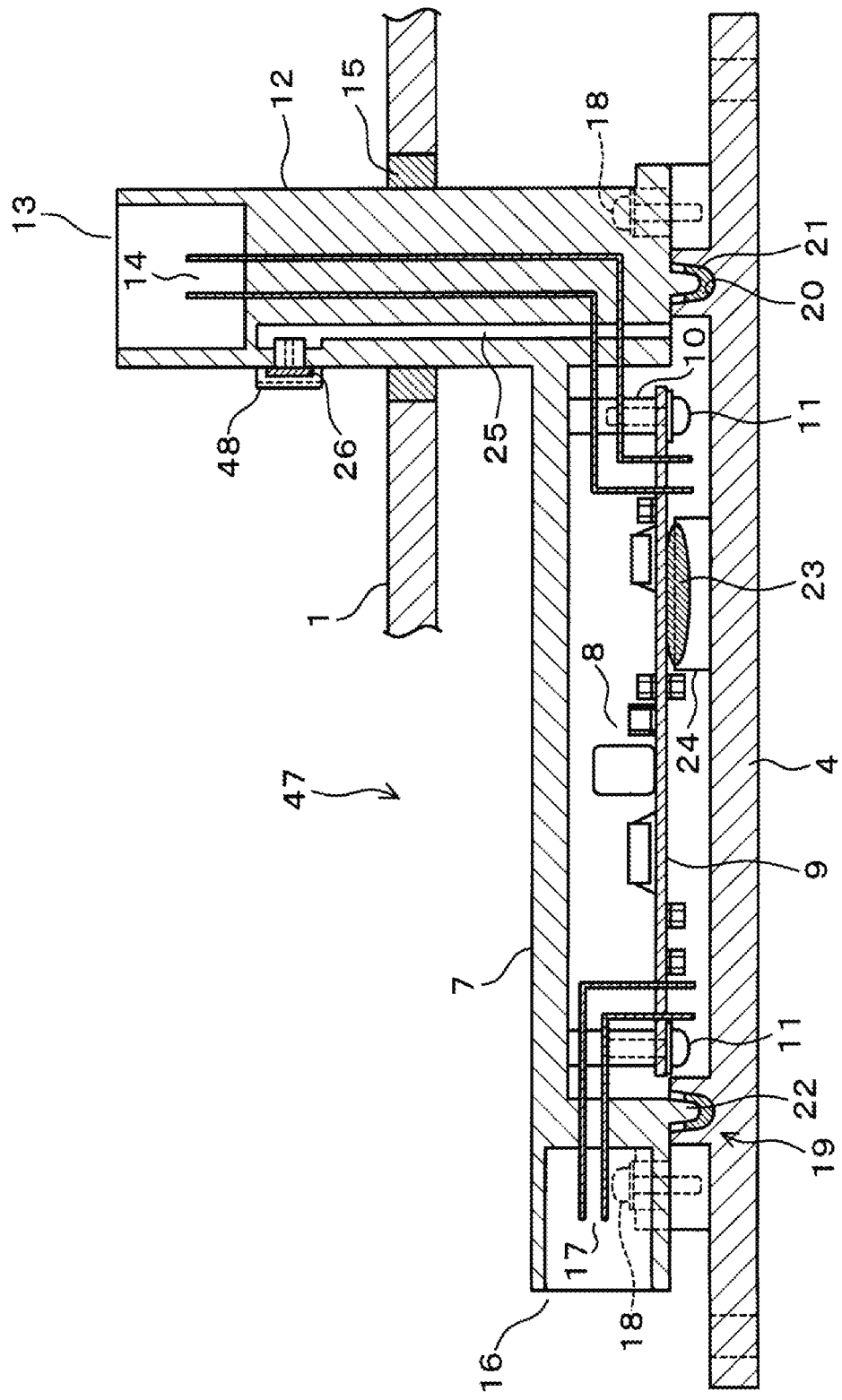
FIG. 13 is a cross-sectional view illustrating the configuration of a TCU according to a seventh embodiment.

A TCU 47 according to a seventh embodiment as illustrated in FIG. 13 is different from the TCU 3 according to the first embodiment. In this embodiment, the TCU 47 has a plug-type breathable filter 48, which replaces the breathable filter 26 and the cover 27. The breathable filter 48 has both functions of the breathable filter 26 and the cover 27. The "Z-series" of a ventilation filter TEMISH (registered trademark) manufactured by Nitto Denko Corporation may be used as the breathable filter 48.

Other Embodiments

The oil-tight seal member may not be limited to fluororubber. The configuration of an oil-tight structure may not be limited to the one illustrated in FIG. 2. An oil-tight structure may be formed by providing a protrusion at the metal bar and providing a groove at the resin cover. A cover for covering the breathable filter may be provided if necessary. The load-side connector 16 may be provided if necessary, and the connection with the inside of the valve body 2 may be made directly. The TCU 3 may not be disposed on the valve body 2.

Although the present disclosure has been described in accordance with the examples, it is understood that the disclosure is not limited to such examples or structures. The present disclosure encompasses various modifications and variations within the scope of equivalents. Furthermore, various combination and formation, and other combination and formation including one, more than one or less than one element may be made in the present disclosure.

It is noted that a flowchart or the processing of the flowchart in the present application includes sections (also referred to as steps), each of which is represented, for instance, as S1. Further, each section can be divided into several sub-sections while several sections can be combined into a single section. Furthermore, each of thus configured sections can be also referred to as a device, module, or means.

What is claimed is:

1. A vehicle control apparatus disposed inside a housing accommodating a transmission, the vehicle control apparatus comprising:
    a metal base made of a metal;
    a resin case attached to the metal base to provide an interior space;
    a printed circuit board, on which an electronic component mounts, that is disposed in the interior space; and
    an oil-tight seal member that is placed between the metal base and the resin case to surround the printed circuit board,
    wherein the electronic component is included in a control circuit for the transmission,
    wherein the metal base and the oil-tight seal member are at a hydrogen bonding state, and
    wherein the resin case and the oil-tight seal member are at a covalent bonding state.

2. The vehicle control apparatus according to claim 1, wherein the metal base is made of aluminum and anodized.

3. The vehicle control apparatus according to claim 1, wherein the resin case is applied with plasma treatment.

4. The vehicle control apparatus according to claim 1, wherein the oil-tight seal member includes fluororubber.

5. The vehicle control apparatus according to claim 1, further comprising:
    a recess that is disposed at one of the metal base and the resin case, and that accommodates the oil-tight seal member; and
    a protrusion that is disposed at the other one of the metal base and the resin case, and that presses a central portion of the oil-tight seal member accommodated in the recess,
    wherein the protrusion has a tip extending in a first direction, and
    wherein, in a case of the resin case attaching to the metal base, a spacing from the tip to the recess in the first direction has a larger width than a spacing between the recess and the protrusion in a second direction perpendicular to the first direction.

6. The vehicle control apparatus according to claim 1, wherein the resin case includes a part having a connector disposed to penetrate inside and outside of the housing,
    wherein the connector includes a ventilation hole, which communicates with the interior space between the metal base and the resin case and the outside of the housing, and
    wherein the vehicle control apparatus further comprises a breathable filter disposed at a location where the ventilation hole faces the outside of the housing.

7. The vehicle control apparatus according to claim 1, wherein the vehicle control apparatus is placed at an atmosphere of lubricant oil, and is covered by the lubricant oil.

* * * * *